United States Patent [19]

Grib

[11] Patent Number: 4,577,164

[45] Date of Patent: Mar. 18, 1986

[54] DRIVE REGULATOR UTILIZING VARIABLE PULSE WIDTH SIGNAL

[75] Inventor: Boris F. Grib, Dix Hills, N.Y.

[73] Assignee: Philamon Incorporated, Farmingdale, N.Y.

[21] Appl. No.: 656,711

[22] Filed: Oct. 1, 1984

Related U.S. Application Data

[63] Continuation-in-part of Ser. No. 16,160, Mar. 1, 1979, Pat. No. 4,499,436.

[51] Int. Cl.$^4$ .......................... H03B 5/30; H03L 5/00
[52] U.S. Cl. .................................... 331/109; 318/128; 331/116 M; 331/156; 331/183
[58] Field of Search ................. 331/109, 116 M, 154, 331/155, 156, 183; 318/114, 119, 129, 130, 128; 368/160, 167

[56] References Cited

U.S. PATENT DOCUMENTS 4,177,434 12/1979 Ida ............................. 331/116 M X

OTHER PUBLICATIONS

Wooton, "Phase-Locked-Loop Control of a Tuning Fork Oscillator", IBM Technical Disclosure Bulletin, vol. 22, No. 3, Aug. 1979, pp. 1088-1090.

Primary Examiner—Siegfried H. Grimm
Attorney, Agent, or Firm—Robert R. Keegan

[57] ABSTRACT

There is disclosed a drive regulation and control circuit for a tuning fork resonator also adaptable to other electrical devices wherein an approximately sine wave signal from a motion sensor is applied to an instantaneous level detector which causes a variable width pulse signal to be on during that portion of the sine wave signal where the instantaneous level exceeds an adjustable reference level; a control signal is generated with a magnitude varying as a moving average of the width of the variable width pulses; the control signal causes the reduction of current to the tuning fork drive to cause reduction of motion amplitude. An optional feature provides rapid response by activating a motion braking signal having a duration approximately equal to the variable width pulse "on" period. A distinctive feature of the instantaneous level detector is the fact that the sine wave signal is not rectified but is rather converted to a fluctuating direct current signal with a DC level accurately determined by an internal semi-conductor voltage reference element.

20 Claims, 9 Drawing Figures

DRIVE REGULATOR UTILIZING VARIABLE PULSE WIDTH SIGNAL

This application is a continuation-in-part of my prior copending application, Ser. No. 16,160, filed Mar. 1, 1979, and now U.S. Pat. No. 4,499,436, entitled "MOTION AMPLITUDE REGULATOR WITH BRAKING PULSE REGULATION".

This invention relates to regulating driving circuits for resonant mechanisms or other alternating current producing apparatus. In a specific example a circuit for driving a tuning fork optical chopper or scanner is described. A principal function of the apparatus is regulation of the amplitude of a sine wave signal associated with alternating current apparatus such as the resonant mechanism of an optical chopper.

This application (and my prior copending application) discloses an amplitude regulator in which the regulating action is provided by a velocity decelerating braking pulse opposed to the normal drive current and having a pulse width varying in direct relation to the time period during which the instantaneous value of a sine wave signal from the regulated device exceeds a constant reference signal. This application further discloses a power regulating drive current control circuit for an electrical device in which there is a pulse signal having a pulse width which similarly varies directly as the excess of a sine wave electrical signal over a constant reference signal; this pulse signal is processed to produce a control signal with a magnitude varying directly as a moving average of the widths of pulses of the pulse signal; the peak drive current to the electrical device is reduced in response to the relatively slowly varying control signal in this circuit. The present application also discloses a drive current control signal circuit which incorporates both of the features described above, namely, a velocity decelerating braking pulse feature and a drive regulation feature utilizing a control signal related to the moving average of the width of variable width pulses described above. The braking pulse feature provides the fastest response at the expense of some extra consumption of power, whereas the drive regulation based on the moving average of pulse width minimizes use of power with a somewhat slower response time. The combination of both features provides a drive current control circuit with high accuracy and fast response time, at the same time minimizing power consumption and undesirable heating of components.

The electrical apparatus of the present invention is well adapted to provide amplitude regulated drive power to a resonant mechanism having a substantial inertial property of "Q", such as a tuning fork. Quality factor "Q" is defined as two pi times the ratio of the maximum stored energy to the energy dissipated per cycle at a given frequency. With mechanical resonators having a "Q" in excess of about 100 energy input is effective at the fundamental frequency regardless of waveform. The effect of a non-sinusoidal wave thus can be determined relative to that of a sine wave. A sine wave with an rms drive current approximately equal to 0.9 of the peak value of a square wave is its effective equivalent. Similarly, other drive waveforms can be considered equivalent to a sine wave of determinable amplitude.

The application of the circuit of the invention to drive mechanical resonators is the most common anticipated application. The circuit incorporating the invention may also be applied to controlling the drive of other alternating current electrical devices having an AC or DC electrical input and either electrical or mechanical output capable of producing an alternating current.

In most optical modulating, chopping, or scanning applications it is desirable to have reasonably constant frequency and reasonably constant motion amplitude. With a properly made self-resonant chopper or scanner, reasonably constant frequency can be achieved by simply stabilizing the stiffness and mass-determining portions of the design which determine self-resonant frequency. Alternatively the chopper may be slaved to a frequency standard or control signal.

Achieving constant motion amplitude however is not as simple. Basically, chopper or scanner motion amplitude is proportional to device "Q" and (in case of electromagnetically driven design) also proportional to drive current applied. "Q" is essentially the inverse of energy losses and the losses can vary depending upon metallurgical friction of bending members, the amount of "out of balance" energy coupled to the base mount mass of the device, the effects of drive and pickup eddy current and hysteresis losses, and, most significantly, the "windage" losses at high motion amplitudes. For example it is not unusual for the "Q" of a chopper to double and thus motion amplitude to double when normal atmosphere windage losses are eliminated by placing it in a vacuum (as in simulated or actual outer space or satellite applications).

Drive current can unintentionally vary depending upon circuit design and component changes and DC input supply voltage changes. A reduction of DC input supply voltage of 20 percent (as might be caused by near exhausted batteries in a satelliete application) could cause a 20 percent decrease in drive current and a consequent loss of 20 percent of desired motion amplitude.

The amplitude regulation objectives of the disclosed invention are accomplished in several steps starting with application of substantially more drive current than is actually needed for desired amplitude. Power regulation is done automatically as determined by a suitably amplified and phased chopper or scanner pickup voltage (directly proportional to motion amplitude) being applied to a novel peak level-detecting zener-referenced AC voltage comparator circuit. An excess of instantaneous pickup voltage (attempted amplitude) over an adjustable reference level (desired amplitude) causes a variable width pulse signal to switch on for the period of time the sinusoidal pickup instantaneous voltage waveform exceeds the reference level. Pulse width is averaged over at least several cycles and the moving average determines magnitude of a control signal which reduces drive current. An optional feature for rapid response provides circuitry for regulating "down" by applying during each cycle of motion a reverse "bucking", "velocity deceleration", or "braking current". The braking current is preferably considerably in excess of normal peak drive current and has a time duration determined by the excess of "attempted amplitude" as compared to that of "desired amplitude".

In addition to providing the features and advantages described above it is an object of the present invention to provide an electronic drive current regulator to electrical devices or electro-mechanical devices such as tuning forks, optical choppers, motors, or the like in which excess motion amplitude is sensed in each cycle and a pulse signal of variable width which is a function of the excess motion amplitude is applied to a control signal generator producing a signal which represents the average of several pulses and reduces the drive current for the device.

It is another object of the present invention to provide a velocity or amplitude regulator for a mechanical device in which the time duration of excess instantaneous velocity of the device is sensed and is caused to correspondingly reduce current in the drive circuit for the device.

It is still another object of the present invention to provide a regulator as described above with the additional feature of a braking circuit in which the time duration of excess instantaneous velocity of the device is sensed and is caused to correspondingly produce an anti-phase pulse in the drive circuit for the device.

A further object of the present invention is to provide in a motion amplitude regulator a capacitively input-coupled zener-referenced peak AC voltage level detector having a symmetrical input impedance which preserves the integrity of the zener determined DC level.

Other objects and advantages of the present invention will be apparent from consideration of the following description in conjunction with the appended drawings in which:

Figure 1:
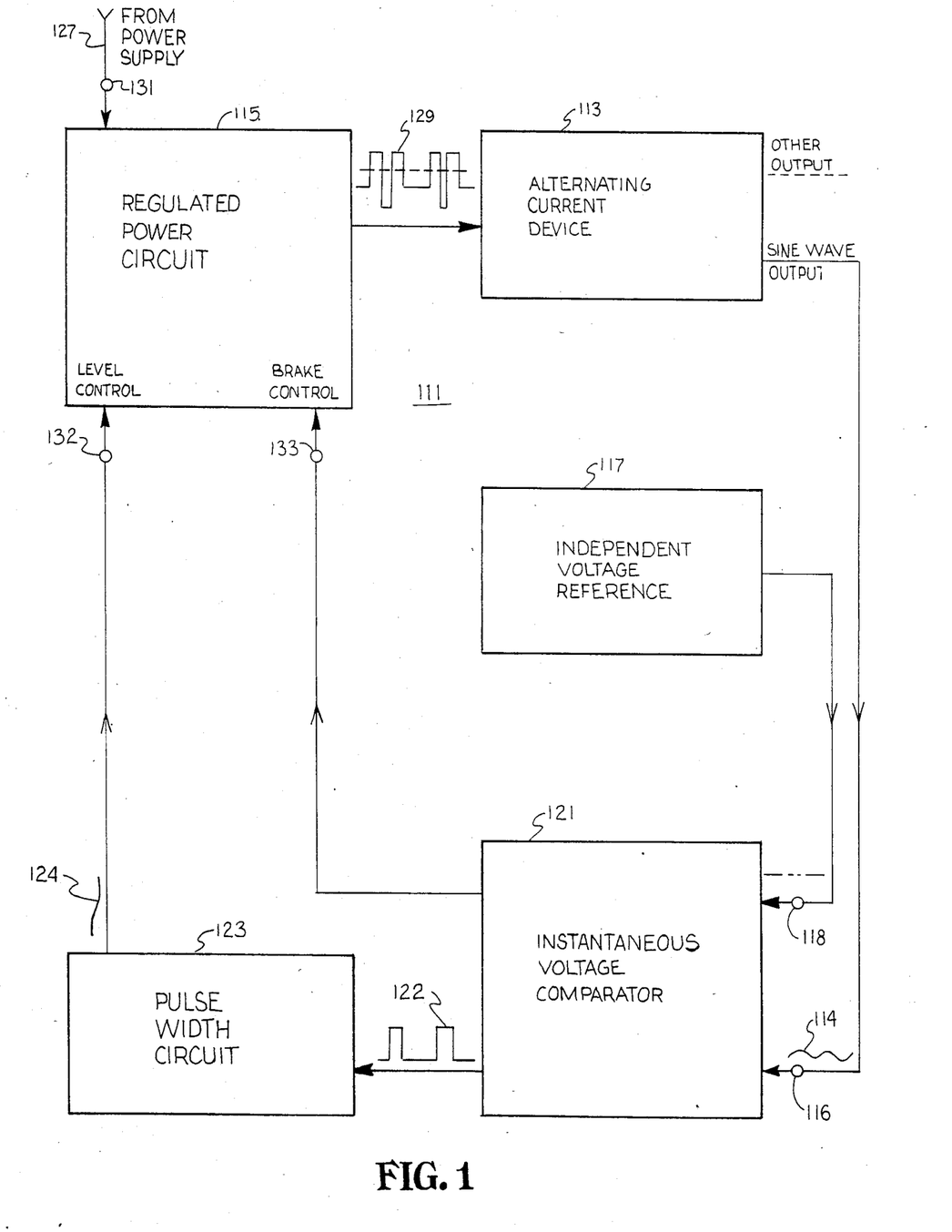
FIG. 1 is a schematic block diagram of a drive regulator utilizing pulse width controlled power regulation action according to the invention.

Referring to the drawings and particularly FIG. 1, drive regulater 111 utilizing variable pulse width signals includes an alternating current device 113 which is driven by current from a regulated drive power circuit 115. The alternating current device 113 has a sine wave output having a waveform as shown at 114. The alternating current device 113 may have one or more other outputs which may be electrical or mechanical and which are not necessarily sine wave in form.

An independent voltage reference 117 produces a constant reference signal which is supplied to an instantaneous voltage comparator 121 at input 118. Another input 116 to the instantaneous voltage comparator 121 is provided with the sine wave output from alternating current device 113. The voltage provided from the independent voltage reference 117 may be adjustable or other means may be provided for setting the comparison level for the sine wave output waveform indicated at 114.

The maximum sine wave output from alternating current device 113 has a peak which exceeds the reference provided by independent voltage reference 117, and instantaneous voltage comparator 121 produces a pulse waveform 122 in which the pulse duration is substantially equal to the portion of the waveform 114 which exceeds the constant voltage of independent voltage reference 117. The greater the excess of the sine wave peak over the voltage reference, the greater is the width of the pulses of waveform 122. Waveform 122 is provided to a pulse width circuit 123 and to an input 133 of regulated drive power circuit 115.

Pulse width circuit 123 produces an output signal having a waveform 124 which represents approximately a moving average of the pulse widths of the pulses of waveform 122. In a specific pulse width averaging circuit later described, the output is provided by the charge of a capacitor which is arranged to charge during the duration of each input pulse at a rapid rate and to discharge at a slower rate between pulses.

The output of pulse width circuit 123 is provided to input 132 of regulated drive power circuit 115. The regulated drive power circuit 115 has a power input terminal 131 connected to a conventional DC power supply by lead 127. Input terminal 132 for regulated power circuit 115 is the drive level control input. This input controls the peak to peak amplitude of the alternating current output component from the regulated drive power circuit 115. As seen in the output waveform 129 from the regulated power circuit 115, there are braking pulses in alternate half cycles of the waveform 128. These velocity decelerating braking pulses have the characteristics and perform the function described generally in prior co-pending patent application Ser. No. 16,160, filed Mar. 1, 1979, and now U.S. Pat. No. 4,499,436, for "MOTION AMPLITUDE REGULATOR WITH BRAKING PULSE REGULATOR". The lowest excursion of the braking pulses in waveform 129 is substantially constant and preferably lower than the low peak amplitude of the alternating current drive signal whereas the width of the braking pulses is controlled at the input terminal 133 of regulated power circuit 115. Thus the braking pulses in waveform 129 have a generally constant depth and a width which generally corresponds to the width of the pulses in output waveform 122 from the instantaneous voltage comparator 121.

As will be understood from the previous general description and the description of the block diagram of FIG. 1, the immediate effect of a substantial excess of the peak of sine wave output compared to the independent voltage reference 117 is the widening of pulses 122. This produces a widening of the braking pulse portion of the waveform 129 within one cycle of operation and tends quickly to diminish the sine wave output of alternating current device 113; it also diminishes any other output that may be provided by alternating current device 113. The control loop through the instantaneous voltage comparator causes the width of the pulses 122 and the braking pulse portion of the waveform 129 to be just wide enough to balance out a very small excess of the sine wave output peak relative to the voltage reference 117. In general a relatively narrow braking pulse will compensate for substantial excess attempted amplitude, but the width of the braking pulse is further reduced by the action of the pulse width circuit 123. The pulse width circuit 123 responds to the width of the pulse in the waveform 122 by increasing the amplitude of the output waveform at 124. This does not occur instantaneously but as a moving average of successive pulses. The time constant for the pulse width circuit might, for example, be equal from about 2 to about 100 pulse repetition periods of waveform 122.

The pulse width circuit 123 has its output connected to the drive level control terminal 132 of the regulated power circuit 115 and causes the peak to peak amplitude of the waveform 129 (ignoring the braking pulse) to be reduced. This reduces the amplitude of the sine wave output to terminal 116 and thus reduces the excess of attempted amplitude and correspondingly reduces the width of the pulses of waveform 122. The longer term correction of the pulse width circuit 123 continues until a balance is reached between the peak to peak amplitude of the waveform 129, and the width of pulses of waveform 122. Thus the action of the pulse width circuit 123 causes the width of the braking pulses 122 to be much narrower than would otherwise be required to regulate the sine wave output of the alternating current device 113. This reduction in the width of the pulses of waveform 122 and the braking pulse portion of the waveform 129 is very desirable because the braking pulse portion of waveform 129 consumes extra power. The control provided by level control terminal 132 which reduces the peak to peak amplitude of the waveform 129 conserves power. Thus it will be seen that the advantage of almost immediate response provided by the braking pulse feature of the circuit is maintained with a minimum disadvantage accruing from the inherent power consumption which is involved in that feature. It is anticipated that the level control feature will find great utility in conjunction with the brake pulse feature derived from the prior co-pending application Ser. No. 16,160. However, the drive regulating level control feature may be used without the brake pulse feature, and it does have advantages in providing a controlled reduction in peak to peak amplitude which is a direct function of the averaged excess amplitude of the alternating current device compared to an independent voltage reference.

Figure 2:
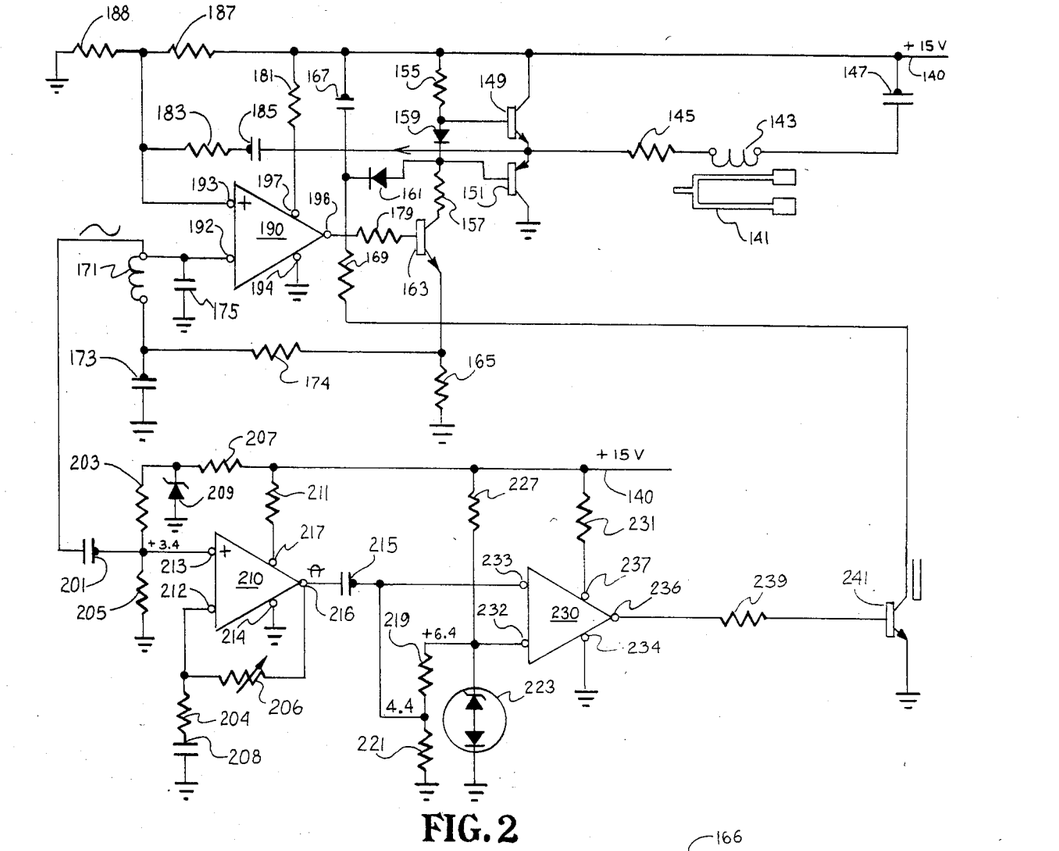
FIG. 2 is a schematic circuit diagram of a first form of pulse width controlled drive power regulator circuit according to the invention.

Referring now to FIG. 2, a schematic circuit diagram is shown for a driving and control circuit having an amplitude control responsive to a variable width pulse signal. Fifteen volts DC is provided on conductors 140 by a conventional power supply (not shown). It is a feature of the present invention that motion amplitude regulation is maintained in spite of substantial variations of the voltage on conductors 140. A tuning fork 141 used as an optical chopper is driven electromagnetically from a drive coil 143 having in series circuit therewith a capacitor 147 and a resistor 145. A pair of transistors 149 and 151 have their emitters connected together and to resistor 145. Transistor 149 is an NPN transistor whereas transistor 151 is a PNP transistor. As more fully explained hereinafter, this provides a characteristic of complimentary symmetry in the circuit which is important for drive energy conservation when regulating.

By virtue of the capacitor 147 only alternating current is permitted to flow through drive coil 143. This is in contrast with a circuit of the parent application (which will be seen in FIG. 4) having a DC as well as an AC current component in the tuning fork drive coil. The circuit of the parent application is very effective in terms of motion amplitude regulation, but it is less efficient in drive dissipation energy thus making it less appropriate for certain applications, particularly where tuning fork chopper 141 and coil 143 are placed in a cryogenic enclosure. In other words, an important consideration is the fact tht the drive coil current in the circuit of FIG. 2 is a true alternating current whereas previous circuits were pulsating DC drive current circuits with a substantial DC current component. It should further be noted that resistor 145 may be moved from the position shown and replaced by two resistors in series with respective emitters of transistors 149 and 151; the junction of those two resistors would then be connected to that end of coil 143 which is connected to resistor 145 in FIG. 2 (as later described in FIG. 6). The resistors in series with the emitters of transistors 149 or 151 has among its advantages that of isolating the two transistors one from the other and diminishing any capacitive loading effect of one transistor on the other.

The operation of transistors 149 and 151 can be explained in an oversimplified manner by considering in one-half cycle that capacitor 147 is charged by current flowing through transistor 151 while on the other half-cycle capacitor 147 is discharged by current flowing through transistor 149. The conducting and nonconducting states of transistors 149 and 151 are controlled by the voltages and currents at the base electrodes of the transistors. The control signal for transistors 149 and 151 is generated by transistor 163 having its emitter and collector electrodes connected in a series path from positive DC conductor 140 to ground through a resistor 155, a diode 159, a resistor 157, and an emitter resistor 165. As will later be explained, transistor 163 provides the basic square wave drive signal for tuning fork 141. In the present case the frequency of the drive signal is controlled from a feedback from fork 141 so that frequency is determined by the mechanical resonant frequency of the tuning fork 141; in other cases an external signal as from a frequency standard could be utilized to drive the tuning fork 141.

Diode 161, capacitor 167, and resistor 169 cooperating with resistor 155 and diode 159 form an averaging circuit which causes the pulse width modulated regulating pulses for the circuit to be averaged in an exponential moving average fashion, as will later be more fully described.

The previously mentioned feedback signal from tuning fork 141 is magnetically induced in coil 171 which will normally be physically adjacent to one of the tines of tuning fork 141. An AC path to ground from coil 171 is provided by capacitor 173 and it is connected to the emitter of transistor 163 through resistor 174.

Integrated circuit 190 is an amplifier serving basically as an operational amplifier. Terminal 197 of IC 190 is connected to plus fifteen volts through resistor 181 and terminal 194 is connected to ground. Pick up coil 171 is connected to input terminal 192 of IC 190 which is capacitively shunted to ground by capacitor 175 for high frequency noise attenuation. An input terminal 193 of IC 190 is provided with a stabilizing negative feedback signal through a loop provided by capacitor 185 and resistor 183 and is biased by a voltage divider formed by resistors 187 and 188. Output terminal 196 of IC 190 is connected through base resistor 179 to the base of transistor 163.

Integrated circuits 210 and 230 and transistor 241 together with associated circuit elements form a motion amplitude sensing peak voltage comparator generating a motion amplitude regulating control pulse. This portion of the circuit operates in a manner very similar to the corresponding portion of the circuit of the parent application (shown in FIG. 4).

The AC signal from coil 171 representative of the velocity of motion of the tine of tuning fork 141 is conveyed through capacitor 201 to an input terminal 213 of integrated circuit 210 which is an amplifier connected as an operational amplifier. A DC level is set for the alternating current signal at terminal 213 by a voltage regulator circuit comprising resistor 207 connected to the fifteen volt supply and having a zener diode 209 connected therefrom to ground thereby establishing a 6.8 volt level at zener diode 209. Resistors 203 and 205 act as a voltage divider providing a 3.4 volt DC level at input terminal 213. Integrated circuit 210 is connected to the fifteen volt power supply through resistor 211 connected to terminal 217. Terminal 214 of IC 210 is connected to ground. The negative feedback for IC 210 is provided from output terminal 216 through variable voltage divider resistor 206 and its junction with resistor 204 to input terminal 212; 204 is connected to ground through capacitor 208. Variable resistor 206 may be adjusted to affect the gain of amplifier IC 210 (which is nominally about 20). As later will be seen this has the effect of changing the relation between the positive going peak of the input sine wave compared to a fixed voltage reference and permits regulation of the tuning fork motion amplitude to be adjusted to achieve the desired motion amplitude level.

As previously explained, it is the purpose of the motion amplitude sensing circuit to detect motion amplitude in excess of the desired motion amplitude and to produce a motion amplitude regulating pulse which is pulse width modulated as a function of "excess amplitude of detected motion". The output of IC amplifier 210 is a linear function of the pickup coil voltage and essentially proportional to the tine velocity of the tuning fork chopper 141. Since peak motion amplitude of the tuning fork chopper 141 is proportional to the peak tine velocity, the output of IC 210 can be considered proportional to either. It should be noted however that the velocity amplitude is 90° out of phase with the displacement amplitude. This phase relation only affects the time of occurrence of the motion amplitude regulating pulse and does not affect its pulse width relationship.

The circuit next compares the positive going instantaneous level of the output of amplifier 210 with a reference voltage. Reference voltage in the present instance is provided by an independent voltage source. That is, it is independent of the power supply voltage and independent of the amplitude of other signals in the circuit. Reference voltage is supplied by a zener diode 223 connected in series with resistor 227, this series circuit being connected between the fifteen volt power supply and ground. This established a fixed independent reference voltage at the zener diode 223, illustrated as 6.4 volts.

A series combination of resistors 219 and 221 is connected in parallel with zener diode 223 as a voltage dividing circuit and provides a fixed independent reference voltage at the junction of resistors 219 and 221; in the specific example this voltage is 4.4 volts.

Integrated circuit amplifier 230 is an integrated circuit connected as a difference amplifier with the voltage (6.4 volts) at zener diode 223 connected to an input terminal 232. Input power terminal 237 is connected through resistor 231 to the fifteen volt power supply and termiinal 234 is connected to ground.

The AC output of amplifier 210 is connected through capacitor 215 to input terminal 233 of IC 230 and to ground through resistor 221 thus a DC reference voltage of 4.4 volts is provided for the AC output of IC amplifier 210. In the absence of a signal from IC amplifier 210 the voltage at input 232 of IC 230 will be greater than that at input 233 of IC 230 so that the output at output terminal 236 of IC 230 is not positive. This output is connected through resistor 239 to switching transistor 241 and in the absence of positive output from IC 230 transistor 241 is not switched.

If there is an output from IC 210 which has a positive peak fluctuating DC voltage less than the difference between the zener voltage of 6.4 volts and the voltage divider voltage of 4.4 volts, i.e. 2 volts, then there will still be no output from IC 230. At the instant that the positive going peak amplitude of the signal from IC 210 (which is representative of the tine velocity) by the slightest amount exceeds 2 volts then the input to terminal 233 of IC 230 exceeds that at terminal 232 and a large positive signal is produced at output 236 due to the high gain of IC 230. This signal immediately switches transistor 241 allowing current to flow through resistor 169 to charge capacitor 167. Equally rapidly, when the peak voltage amplitude at terminal 216 of IC 210 drops below the 2 volt reference voltage established by zener diode 223 and the voltage divider circuit of resistors 219 and 221, IC 230 turns off and transistor 241 is switched off. The switching time is measured in small fractions of a millisecond. Thus, for every cycle of the waveform from coil 171 an essentially square wave pulse will be generated if the peak amplitude of the waveform exceeds the reference and the width of this pulse will be a non-linear function of the excess of the motion amplitude signal over the reference. As explained more fully in the parent application, which explanation is incorporated by reference here, the width of the motion amplitude regulation pulse is not linearly proportional to the excess amplitude of the motion pickup signal voltage; because of the rounded top of the sinusoidal waveform a very small excess motion pickup signal voltage creates a relatively large pulse width. Thereafter the pulse width increases approximately as the square root of the excess amplitude.

To better understand the operation of the circuit and the interrelationship between the portions thereof, it is desirable to first consider the operation of transistors 149 and 151 which supply the drive coil 143 with a true alternating current drive. To gain an intuitive understanding of the operation of drive transistors 149 and 151 it is desirable to consider first their operation in the absence of any regulating system. One should accordingly remove from consideration transistor 241, resistor 169, capacitor 167, and diode 161. This may be done with validity in the postulated situation, namely the absence of any motion amplitude control pulses.

Further consider that transistor 163 is being switched to provide a square wave signal to the transistors 149 and 151. The base voltage of transistor 149 and 151 is determined by a voltage divider consisting of resistor 155, diode 159, and resistor 157. When transistor 163 is on, the upper end of resistor 157 connected to the cathode of diode 159 determines the base voltage of transistor 151 (in the illustrated circuit 6.9 volts). Since transistor 151 is a PNP transistor its emitter voltage is about 0.6 volts higher than the base voltage, namely 7.5 volts. The forward voltage drop of diode 159 is also 0.6 volts so that the base of transistor 149 is at 7.5 volts and its emitter is also 7.5 volts. With a base to emitter voltage of zero, transistor 149 will be off. Thus when transistor 163 is on, NPN transistor 149 is off and PNP transistor 151 is on. This causes current flow through coil 143 to charge capacitor 147.

Considering now the situation when transistor 163 is off; the base voltage of transistor 149 is determined by the voltage at the bottom of resistor 155 at its junction with the anode of diode 159 and will be very close to fifteen volts, perhaps 14.9 volts. Since transistor 149 is an NPN transistor its emitter voltage will be approximately 0.6 volts lower at about 14.3 volts. With a base to emitter voltage of zero, transistor 151 will then be cut off.

Accordingly when transistor 163 is off, transistor 151 is off, transistor 149 is on, and current will flow in the direction opposite to that previously described through drive coil 143 as capacitor 147 discharges through transistor 149. Using the positive current convention, when transistor 163 is on, current flows from capacitor 147 through coil 143 and through transistor 151 to ground; and when transistor 163 is off, current flows from transistor 149 and thence back through coil 143 to capacitor 147.

Thus, it will be seen that transistors 149 and 151 have complementary symmetry which provides a true alternating current through coil 143. Transistors 149 and 151 also provide current gain (since they are connected as emitter followers) and this gain permits much lower current through transistor 163 than is demanded for the coil 143 to drive tuning fork 141.

With this understanding of the basic operation of transistors 149 and 151 with their complementary symmetry it is timely to consider the effect of the application of drive regulating pulses in the circuit of FIG. 2. A drive regulating width-modulated pulse produced at transistor 241 creates a charge current path for capacitor 167 through current limiting resistor 169. The extent to which capacitor 167 is charged is primarily dependent on the width of the drive regulating pulses. While transistor 163 is off, capacitor 167 may discharge through diode 161, diode 159, and resistors 155 producing a voltage drop across resistor 155. This keeps the anode of diode 159 and the base of transistor 149 from rising in voltage as they would otherwise do when transistor 163 is off. The peak drive voltage out of the emitter of transistor 149 is lower, and thus the peak to peak drive voltage applied to drive coil 143 is reduced. In the absence of drive regulating pulses to charge capacitor 167 its voltage will fall to nearly zero and no capacitor discharging current will flow through resistor 155 to lower the output of transistor 149. Accordingly the charge voltage of capacitor 167 will represent a moving average of a plurality of cycles of drive regulating pulses (in fact, very close to a true exponentially smoothed moving average). The time constant of the circuit may be from 2 to 500 cycles. The charge on capacitor 167 produces essentially a proportional current flow and voltage drop across resistor 155, which in turn causes a drop in peak voltage for transistor 149 and a reduction of the peak to peak drive voltage for coil 143.

Thus, it will be seen that capacitor 167, diodes 161 and 159, and resistors 169 and 155 operate as an averaging circuit so that the drive regulating voltage which appears across resistor 155 is proportional to a moving, exponentially smoothed average of the width of the drive regulating pulses at transistor 241.

Figure 3:
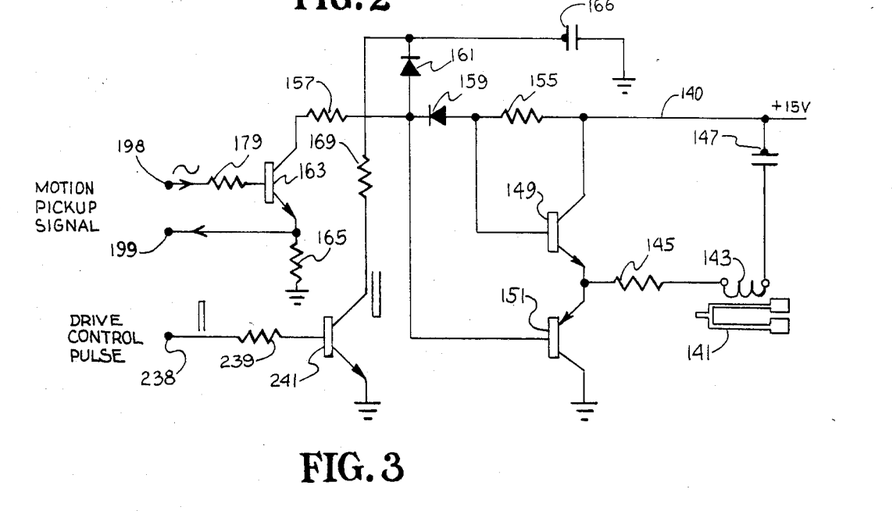
FIG. 3 is an alternative form of pulse width controlled drive power regulator circuit according to the invention.

It will be apparent that specifically different circuits may be utilized to perform substantially the same function in the exemplary circuit of FIG. 2. As one example, FIG. 3 chows a circuit with a different form of averaging circuit operation which is nevertheless substantially equivalent. FIG. 3 is a simplified schematic of the drive regulating portion of the circuit of FIG. 2 having a slightly different pulse averaging circuit configuration. Those portions of the circuit of FIG. 2 which are not shown in FIG. 3 will be essentially the same for the FIG. 3 circuit. The circuit of FIG. 3 differs only in that capacitor 167 of FIG. 2 which is in series with resistor 169 has been replaced by a capacitor 166 which is connected to ground and essentially in parallel with resistor 169. Thus while capacitor 167 was charged by current through resistor 169, capacitor 166 is discharged by current through resistor 169. In FIG. 3 the voltage drop across resistor 155 which regulates the peak to peak voltage amplitude driving the current through coil 143 is from a charging current for capacitor 166 while transistor 163 is off. The magnitude of the current through resistor 155 will depend in essence on the difference between the power supply voltage of fifteen volts and the charge on capacitor 166. In the absence of drive regulating pulses to discharge capacitor 166 its voltage will rise to nearly fifteen volts and no capacitor charging current will flow through resistor 155 to lower the output of transistor 149.

Drive regulating pulses from transistor 241 will discharge capacitor 166 and the extent of the discharge will depend upon a moving average of the width of those pulses. The extent of the discharge of capacitor 166 will determine the charging current through resistor 155, the voltage drop across that resistor and the reduction in the peak to peak driving voltage for coil 143 from the emitter of transistor 149. Thus, while the circuit of FIG. 3 is different than that of FIG. 2 and its operation is different it is essentially a mirror image and produces the desired results in an analogous manner.

The drive regulation circuits of FIGS. 2 and 3 utilizing regulation responsive to the average of drive regulating pulse widths are very effective and well adapted to circuits where heat dissipation must be reduced and where energy must be conserved. However it is very desirable to combine with them the braking pulse motion amplitude regulation feature of prior co-pending application, Ser. No. 16,160. The manner in which these features may be combined should be prefaced by an explanation of the braking pulse drive regulation circuit of FIG. 4.

Figure 4:
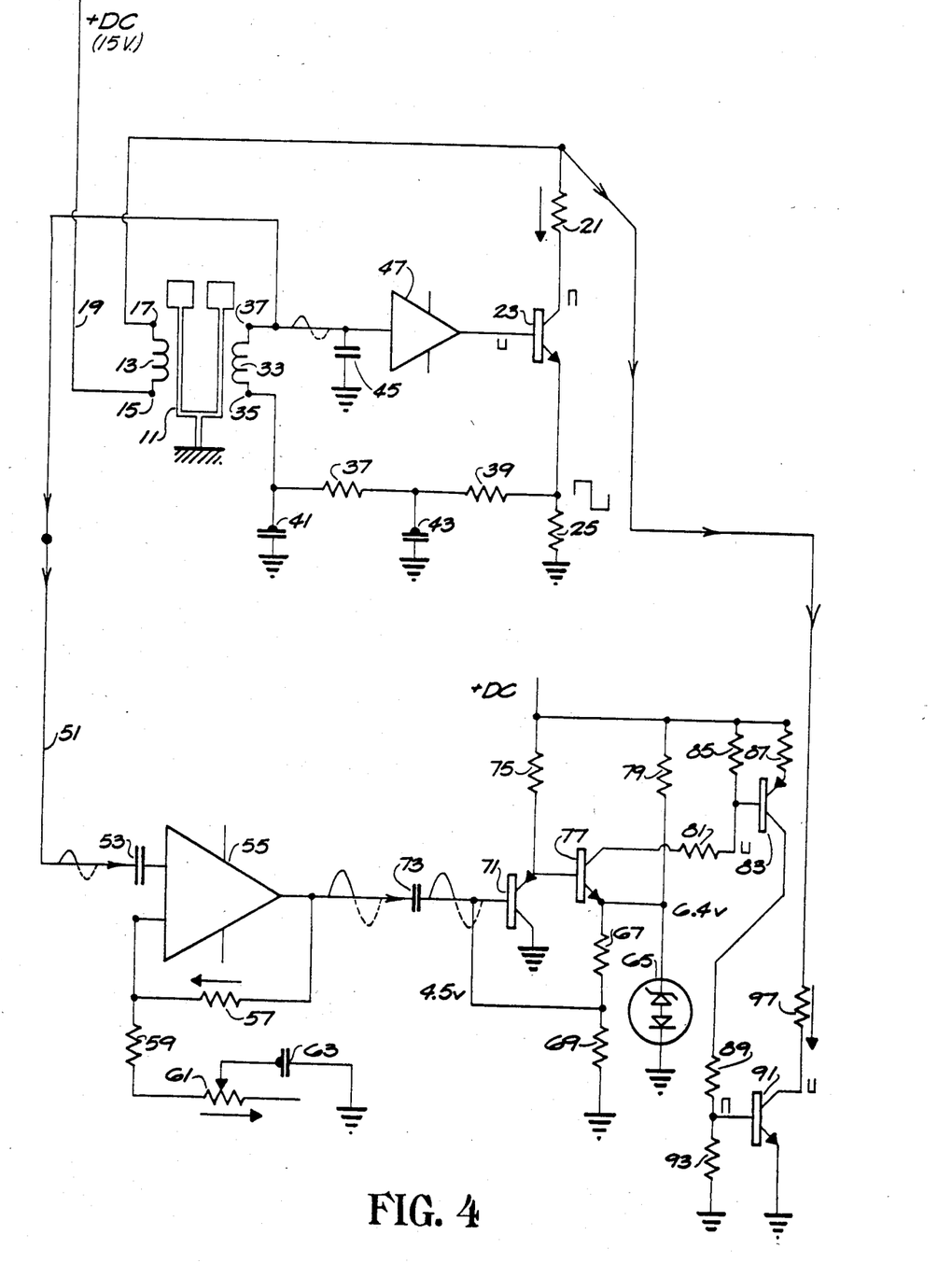
FIG. 4 is a schematic circuit diagram of a motion braking regulator apparatus with a pulse width controlled braking current feature.

Referring to FIG. 4 an optical chopper 11 is shown schematically which consists essentially of a tuning fork having a pair of vanes or shutters mounted thereon between which a light beam will be passed. The particular construction of the optical chopper 11 is not relevant to the present invention and in fact the motion amplitude regulator of the invention may be applied to control of numerous forms of resonant or non-resonant devices which are electromagnetically driven.

A drive coil 13 is provided for the tuning fork of chopper 11; coil 13 has terminals 15 and 17. Terminal 15 is connected by lead 19 to DC power supply which may, for example, be a 15 volt regulated power supply.

Terminal 17 of drive coil 13 is connected through a resistor 21 to the collector of a transistor 23. The emitter of transistor 23 is connected through resistor 25 to ground. Thus, when transistor 23 is conducting as a result of the signal applied to its base, drive current will flow through drive coil 13, resistor 21, transistor 23 and resistor 25 to ground.

The drive circuit for the chopper is a conventional self-biasing circuit. A pickup coil 33 having terminals 35 and 37 provides the pickup signal for the regenerative oscillator circuit. Terminal 35 of pickup coil 33 is connected through a filter circuit consisting of resistors 37, 39 and capacitors 41, 43, to the positive end of resistor 25. Upon initial application of plus DC voltage resistor 25 biases the collector of transistor 23 midway between on and off thus permitting initial maximum loop gain for starting oscillation.

The voltage of pickup coil 33 appears at the ungrounded terminal of capacitor 45 and is amplified in the proper phase relation in conventional operational amplifier 47. Amplifier 47 may have a gain of approximately 40 which is more than sufficient to apply an amplified inverted pickup signal to the base of transistor 23 causing transistor 23 to supply a substantially square wave pulse drive current of proper phase to drive coil 13.

The apparatus thus far described is a generally conventional drive circuit for a tuning fork oscillator or optical scanner. The conventional drive circuit produces a constant frequency oscillation due to the inherent frequency stability of the tuning fork or optical scanner but amplitude of the resonant mechanical device is not controlled or regulated by the conventional drive circuit.

In order to regulate the amplitude of the resonant mechanical device the circuit of FIG. 4 takes an output signal from pickup coil 33 over lead 51 through capacitor 53 to amplifier 55. Amplifier 55 is a conventional operational amplifier with a feedback resistor 57 connected from its output to its input. The feedback input of amplifier 55 is connected through resistor 59, variable resistor 61 and capacitor 63 to ground. Adjustment of resistor 61 to increase its resistance decreases the gain of amplifier 55 and as will later be seen produces an increase in the regulated motion amplitude. Amplifier 55 may have a nominal gain of about 23.

It is the purpose of the motion amplitude braking pulse regulator to detect motion amplitude in excess of the desired motion amplitude and apply a braking current to reverse drive coil 13 for optical chopper 11. The output of amplifier 55 is a linear function of the pickup coil voltage which is essentially proportional to the tine velocity of the optical chopper 11. Since its peak motion amplitude is proportional to the peak tine velocity, the output of amplifier 55 has a peak which is essentially a linear function of the optical chopper motion amplitude. The output of amplifier 55 is actually responsive to motion velocity, thus it is 90° out of phase with the instantaneous amplitude of the optical chopper tine motion; this, however, it not material to the operation of the circuit because the important phase relationship is that between the output signal of pickup coil 33 (and of amplifier 55) relative to the drive current supplied to drive coil 13.

From the previous discussion it will be seen that it is desired to compare the positive going instantaneous level of the output of amplifier 55 with a reference voltage. The reference voltage is supplied by a zener diode 65 which may have a reference voltage of 6.4 volts for example. Resistors 67 and 69 form a voltage divider which produces a fraction of the reference voltage of zener diode 65 (for example 4.5 volts) at the base of a transistor 71 to which is also connected the output of amplifier 55 through a capacitor 73. Transistor 71 is a PNP transistor with its collector grounded and its emitter connected through resistor 75 to the positive DC power supply.

The emitter of transistor 71 is connected to the base of an NPN transistor 77 having its emitter connected to the positive terminal of zener diode 65. The positive terminal of zener diode 65 is connected through a resistor 79 to the positive power supply. The collector of transistor 77 is connected through a resistor 81 to the base of a transistor 83 which is also connected through a resistor 85 to the positive power supply. Transistor 83 is a PNP transistor. The emitter of transistor 83 is connected through a resistor 87 to the positive power supply while its collector is connected through a resistor 89 to the base of a switching transistor 91.

The base of transistor 91 is connected through a resistor 93 to ground; the emitter of transistor 91 is connected to ground. The collector of transistor 91 is connected through a resistor 97 to the terminal 17 of drive coil 13 to provide an alternate current path for drive current through coil 13, resistor 97, and transistor 91 to ground.

The zener diode 65 in conjunction with voltage dividing resistors 67 and 69 set a DC level for the output of amplifier 55 at 4.5 volts at the base of transistor 71. At the same time a level of 6.4 volts is set for the emitter of transistor 77 which is paired with transistor 71. Therefore, when the AC output of amplifier 55 coupled through capacitor 73 slightly exceeds a positive instantaneous value of 1.9 volts (6.4 volts minus 4.5 volts), transistor 71 starts to turn off, turning on transistor 77 and in turn transistor 83 and finally switching transistor 91, causing "reverse" braking current to flow through drive coil 13. While the level detecting circuit resembles a peak detector, it might be more accurately designated an instantaneous level detector because it deactivates on the down-going side of the peak.

It is important to note that there is no DC level shift due to the change in the level of the output of amplifier 55 nor is there any DC level shift from changes in power supply voltage. Thus, the peak (positive) value of the AC output from amplifier 55 (which is a predetermined multiple of the pickup coil output) is accurately determined. The positive peak of slightly more than 1.9 volts corresponds to about 1.4 volts rms. With a gain for amplifier 55 of about 23, the regulated level of output of pickup coil 33 is about 61 millivolts rms.

The remarkable efficacy of the AC instantaneous level comparator circuit of FIG. 4 can only be appreciated in terms of the problems existing with previous circuits. The basic objective of the circuit is to measure the AC peak level and consequently one utilizes capacitive coupling as represented by capacitor 73 to eliminate any effect from the level of the DC component at the output of amplifier 55. That technique is also used in prior circuits.

However, prior circuits commonly have next rectified the AC signal coupled through the coupling capacitor. As a result the input impedance viewed looking forward from the coupling capacitor is dependent upon the instantaneous voltage level. There is a certain threshold below which current is not drawn by the input to the next stage whereas above that level significant current is drawn. Such an asymmetrical current drain charges the coupling capacitor at the input and produces an error because DC level is thereby affected by the magnitude of the AC signal. It has been suggested that this problem can be remedied by inserting a buffer stage in the circuit but such remedy may itself create other problems.

In the circuit of FIG. 4 a different approach is used which essentially avoids rectification of the AC signal by causing the mid-value of the AC voltage waveform to be raised to a specific, accurately regulated value.

As seen in FIG. 4 the zener diode designated 65 produces an accurately controlled voltage (in this case 6.4 volts) at the emitter of transistor 77. The resistors 67 and 69 form a voltage divider between the emitter and ground, the center tap of which is connected to the input at the base of transistor 71. The voltage divider center tap voltage thus determined (in this case 4.5 volts) causes the DC level seen by transistor 71 to be accurately set at a fixed value which does not vary with the AC level.

Figure 7A:
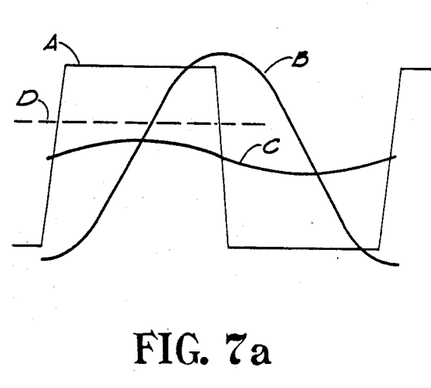
FIGS. 7a, 7b, and 7c are waveform diagrams of the circuit of FIG. 4.
Figure 7B:
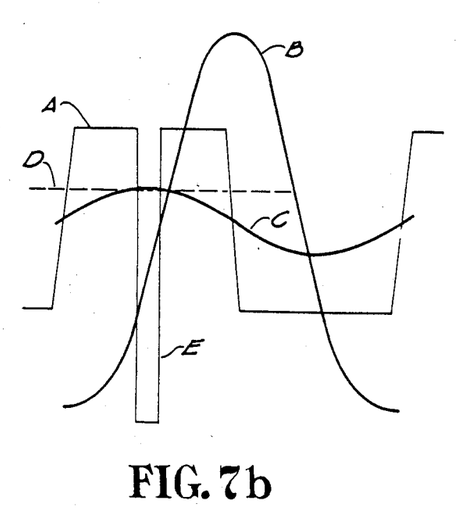
Figure 7C:
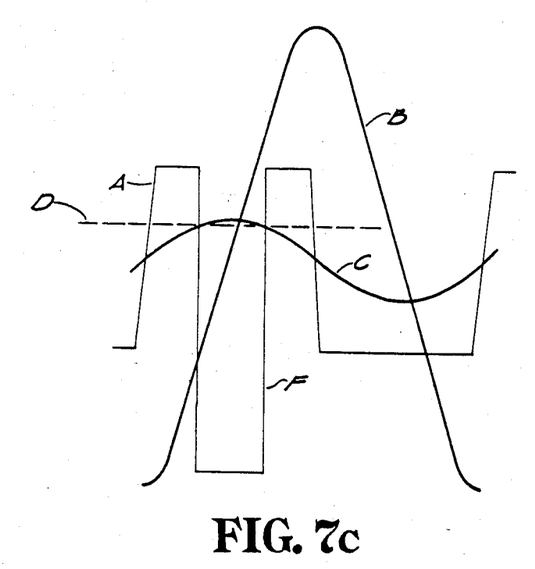

The turn on of the braking current by switching transistor 91 will be better understood by reference to FIGS. 7A, 7B, and 7C. In FIG. 7A the approximately square waveform A represents the drive current to coil 13 without motion amplitude regulation; this situation would prevail during startup of optical scanner oscillations before buildup of the desired motion amplitude. For comparison purposes the chopper amplitude waveform is shown at B in FIG. 7A. It will be noted that the amplitude waveform representing physical displacement of the chopper vanes is (lagging) 90 degrees out of phase with the drive current.

The convention used in 7A is that the upper level of waveform A represents drive current with transistor 23 off while the bottom level represents drive current with transistor 23 on.

Waveform C in FIG. 7A represents the output of pickup coil 33 which is essentially a linear function of velocity. Waveform C leads waveform B by 90° and is thus in phase with waveform A The waveform from pickup coil 13 could, of course, be reversed (shifted) 180° by a reversal of the connections of terminals 35 and 37.

FIGS. 7B and 7C show the operation of the braking current switching controlling the optical scanner motion amplitude. It will be noted in FIG. 7B that the instantaneous amplitude of the pickup waveform C has very slightly exceeded the level D determined by the gain of amplifier 55 and the detection level of the instantaneous level detector circuit. Thus, for approximately 10 degrees before and after the peak of waveform C the instantaneous level detector circuit will cause transistor 91 to be turned on. This occurs during the period that drive transistor 23 is off. However, the turn on of transistor 91 causes a pulse of drive current indicated at E for a duration of about 20 degrees. The timing of pulse E makes it 180 degrees out of phase with the normal drive current thus producing a braking effect diminishing the motion amplitude of the optical chopper. The greater the width of pulse E the greater the braking effect. Thus, as shown in FIG. 7C, when the amplitude of the pickup waveform C is still more in excess of the level D, the braking pulse F which is correspondingly wider has a still greater braking effect.

It will be noted that the braking pulses E and F are of greater amplitude than the normal drive pulse of waveform A. This is due to the fact that resistor 97 has a value substantially less than resistor 21. For example, the relative values of resistors 21 and 97 may be determined so that the combination of the resistance of resistor 97 and the drive circuit resistance is about 50 percent of the combination of the resistance of 21 and the drive circuit resistance. This factor can be further reduced to about 20 percent beyond which there appears to be little effect. The effect of greater magnitude of braking pulses E and F is that much greater braking effect may be achieved from the same width (or narrower) braking pulse. The energy per unit time (or the power) provided by drive current or braking current is proportional to the square of the current amplitude. Therefore, if braking current is twice drive current its effect is four times as great over the same time period. Hence the braking time period can be shortened to produce a given braking power required to regulate the amplitude. If adequate braking is achieved by a narrow pulse the regulation is much more accurate and will be maintained within a few percent or less.

It is worthy of note that the operation of the instantaneous detection circuit is such that only a very small excess motion amplitude produces a relatively wide braking pulse and thus the range of regulation is small and the regulation accuracy good. For example, a motion amplitude excess of one percent will cause the pickup waveform to intercept the detection level at about eight degrees before and after the peak or center of the waveform. Thus, the braking current pulse may last almost 10 percent of one-half cycle of the driving current when there is only a one percent excess motion amplitude relative to the setting of the peak level detector. Ten percent pulse time will produce a much greater than 10 percent braking power due to the larger braking current and the square of current effect previously discussed. In practice, of course, circuit parameters will be set so that there is always some excess drive current and always a braking pulse of greater or less width as required to bring the motion amplitude back to the desired level.

The motion amplitude braking pulse circuit of FIG. 4 will be seen to be particularly adapted to control tuning forks, optical choppers, scanners and similar resonant apparatus wherein the "Q" of the mechanically resonant apparatus is relatively high, say over 100. Usually, the "Q" of such apparatus will be a thousand or more. The high "Q" means that the energy stored in the oscillating mechanical resonator is high compared to the energy which must be provided to maintain a steady oscillation. Therefore, the waveform of the cyclic pulses which drive the resonator is of little importance since a single pulse produces little change in the energy of the system and consequently little change in the motion amplitude or the velocity. At the same time it is very beneficial to detect small changes in the instantaneous velocity (which is proportional to amplitude) and apply immediate correction to obtain quick regulation response.

It has been found for example that when the motion amplitude regulation circuit of FIG. 4 is applied to a mechanically resonant device such as an optical chopper extremely accurate motion amplitude regulation can be achieved. Such a chopper which experiences a 100 percent increase in amplitude upon evacuation of the chopper housing with the consequent decrease in air drag is found to be regulated to only a three percent increase in motion amplitude when the circuit of FIG. 4 is incorporated in the drive for the chopper. Similarily such a chopper which experiences plus or minus 20 percent motion amplitude variation with DC input voltage changes is limited to a motion amplitude variation of plus or minus two percent with the circuit of FIG. 4. Table I below shows exemplary circuit element values and semi-conductor type numbers for the circuit of FIG. 4.

TABLE I

| ELEMENT REF. NO. | VALUE |
| --- | --- |
| RESISTANCE: | OHMS: |
| 13 | 200 |
| 21 | 1200 |
| 25 | 71.5 |
| 37 | 100. |
| 39 | 1000. |
| 57 | 20K |
| 59 | 470 |
| 61 | 2000 |
| 67 | 4220 |
| 69 | 10K |
| 75 | 47K |
| 79 | 2700 |
| 81 | 4300 |
| 85 | 2400 |
| 87 | 200 |
| 89 | 6200 |
| 93 | 4700 |
| 97 | 536 |
| CAPACITANCE: | MICROFARADS: |
| 41, 43 | 56. |
| 45 | .01 |
| 73 | 6.8 |
| 63 | 47. |
| SEMICONDUCTORS: | TYPE NUMBERS: |
| 23 | 2N2219A |
| 71, 83 | 2N2907A |
| 77, 91 | 2N2222A |
| 65 | 1N4576A |

Figure 5:
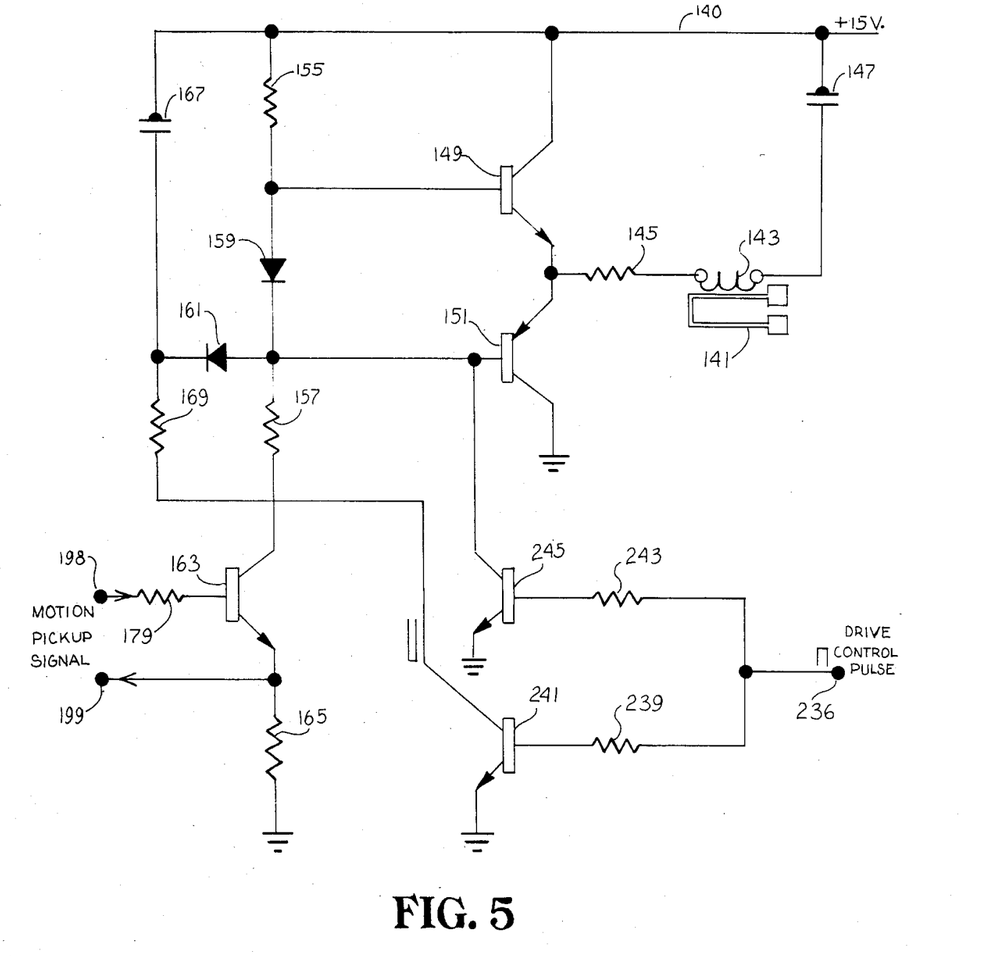
FIG. 5 is a schematic circuit diagram of another alternative circuit including features of the circuits of FIGS. 2 and 4.

FIG. 5 shows the manner in which the advantageous features of motion braking pulse regulation can be added to the circuit of FIG. 2. FIG. 5 shows only the regulator portion of the circuit and all portions not shown in FIG. 5 may be identical to the circuit shown in FIG. 2.

FIG. 5 has the configuration of circuit elements for motion amplitude regulation as shown in FIG. 2 and they are identified by the same reference numbers. In addition, FIG. 5 includes a transistor 245 with a base resistor 243 through which it is connected to receive an amplitude pulse input from a terminal such as output terminal 236 of IC 230 (FIG. 2).

Transistor 245 has its emitter connected to ground and the output from its collector connected to the base of transistor 151 which is the second one of the pair of driver transistors 149 and 151 for coil 143. It will be noted that transistors 241 and 245 are connected essentially in the same manner and the output of transistor 245 is essentially similar to that of transistor 241 which has been termed a drive regulating pulse. The derivation of these pulses has been described in detail with reference to FIG. 2 and will not be repeated. In the description of FIG. 2 the drive regulation pulse was only applied from transistor 241 to an averaging circuit to produce a drive regulation voltage across resistor 155. In the circuit of FIG. 5 such a pulse is also applied to the base of transistor 151 to produce a motion braking pulse equivalent to that described in the circuit of FIG. 4. Diode 161 prevents transistor 245 from affecting capacitor 167. The motion braking pulse triggered by transistor 245 occurs only once each cycle, and it occurs near the center of the half cycle in which transistor 163 is off. As previously explained in the description of FIG. 2, transistor 151 follows transistor 163 and is off when transistor 163 is off. At such time the state of transistor 149 is opposite, i.e. transistor 149 is "on" under these conditions. The voltage at the emitters junction is very high (about fourteen volts or more) and capacitor 147 is rapidly discharging. However, when a braking pulse is applied due to transistor 245 switching on, the base of transistor 151 is pulled down to about 0.1 volts and its emitter is pulled down to about 0.7 volts. This represents an extreme drop in voltage at the emitter junction and capacitor 147 draws a large charging current through coil 143, resistor 145, and transistor 151. As explained in the parent application and with reference to FIG. 4 the braking pulse does not only reduce the drive to tuning fork 141 but applies a strong reverse driving force which subtracts velocity (and energy) from the tuning fork resonant system and decreases its motion amplitude.

In the specific circuit of FIG. 5 it will be noted that the emitter junction positive driving voltage level is about 14 volts and its negative driving voltage level is about 7 volts, but the braking voltage is less than 1 volt. That is, the difference in peak to peak drive voltages is about 7 volts, but the difference between the braking voltage and the instant normal drive voltage is about 14 volts. Thus the transition from normal drive voltage to braking voltage represents twice the difference between drive voltage of one polarity and drive voltage of the opposite polarity.

Summarizing the description of FIG. 5 is will be seen that the advantages of very fast regulation possessed by the circuit of FIG. 4 may be added to the circuit of FIG. 2 (or FIG. 3) by the simple expedient of applying the drive control pulse input to transistor 241 to another transistor 245 which gates the base of transistor 151 to ground to produce a strong motion braking pulse. The waveforms of FIG. 5 would be generally similar to the waveforms shown in FIG. 7 for the circuit of FIG. 4 except that contemporaneously with the motion braking pulse control there would be drive regulation derived from the average pulse width of drive control pulses. These two forms of regulation are not in conflict and in fact enhance each other in a remarkable way. Assume, for example, that due to depressurization of the environment of the tuning fork 141 or some other reason the motion amplitude or tuning fork 141 increases above the desired level; the immediate effect, within one cycle, would be widening of the drive control pulse. The drive control voltage across resistor 155 would not immediately change to a substantial extent because of the average effect of capacitor 167. However, there would be an immediate widening of the braking pulse applied to the base of transistor 151 and thereby to the braking pulse current flow through coil 143. In the previous circuit of FIG. 4 there would be a tendency for the braking pulse to continue to be significantly wider than before since that would be necessary for continued reduction of the drive for the tuning fork 141. However, in the circuit of FIG. 5 after a few cycles the average width of the drive control pulse as accumulated by capacitor 167, and evidenced by an increased voltage drop across resistor 155, would significantly decrease the peak to peak driving voltage applied to coil 143; this will result in a narrower drive control pulse which will cause the system to be again at equilibrium. Thus the first effect of a need for diminished drive to tuning fork 141 is an expansion of the width of the drive control pulse and an expansion of the motion braking pulse width. This maintains tight control of the regulation of the motion amplitude of fork 141. In a few cycles, however, the peak to peak regulation based on average amplitude control pulse width takes over and most of the long term regulation function is achieved by reducing peak to peak drive voltage rather than by expanding the width of the motion braking pulse. This substantially eliminates the disadvantage of the motion braking pulse control circuit relating to its energy inefficiency as a long term control.

It will be understood by those skilled in the art that the motion braking pulse technique also may be applied to rotary electric motors. An electromagnetically driven tuning fork resonator is, of course, an electric motor also, but it produces vibratory motion rather than rotary motion. The basic applicability of the instant motion braking pulse circuitry to rotary motors would be to DC motors although it would also be applied to synchronous or other alternating current powered motors. For example a conventional DC motor with a split-ring commutator may be provided with a shaft mounted magnetic gear tooth arrangement together with a magnetic pickup coil to produce a velocity sensitive sine wave in response to motor shaft motion (this is in effect an AC tachometer). This sensor would be analogous to the tuning fork pickup coil. Excess velocity of the motor would cause the level comparator to trigger the motor's power supply to produce a negative or braking current which could be on the order of at least twice the motor forward drive current. Due to the large reverse voltage produced by the motor back emf in a rotating motor it is possible to obtain large braking currents by means of a near short circuit of the motor windings. This is the well known dynamic braking effect, which could be utilized under control of the instantaneous AC level comparator circuit eliminating any necessity for applying a reverse voltage. This technique may be particularly applicable to electric motors employing electronic commutation. In such case an electromagnetic or other sensor of the shaft position for controlling commutation may also be employed to provide the AC (sine wave) voltage signal supplied to the instantaneous AC level comparator circuit.

Figure 6:
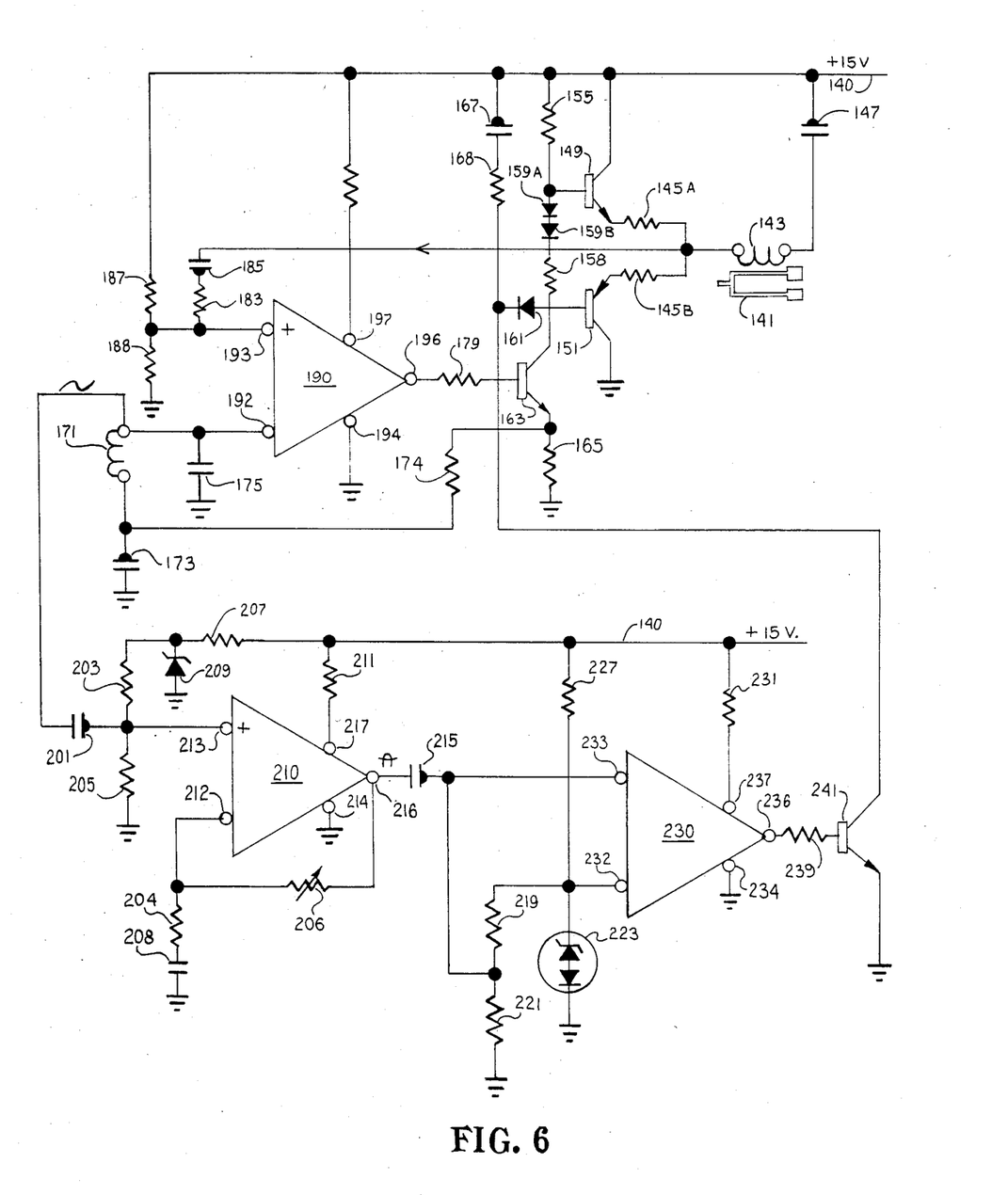
FIG. 6 is a further alternative circuit having the operational features of FIG. 5 wherein a fewer number of circuit elements are employed by causing sub-circuits to perform multiple functions.

FIG. 6 shows a preferred embodiment of a combined braking pulse and pulse width average regulation system which employs single circuit elements to achieve multiple functions. For the most part the circuit of FIG. 6 is identical to the circuit of FIG. 5 and FIG. 2, and consequently the structure and function of those portions of the circuit of FIG. 6 which are identical to FIG. 2 or FIG. 5 will not be discussed in detail. Resistance values, capacitance values, etc are shown in Table II.

It will be noted that in FIG. 6 there is only one transistor 241 with a base resistor 239 connected to receive a drive control pulse input from output terminal 236 of IC 230. In FIG. 6 the transistor 241 performs the function of transistor 241 in FIG. 5 and also performs the function of transistor 245 in FIG. 5.

Resistor 168 in FIG. 6 performs the function of resistor 169 in FIG. 5 and is connected between capacitor 167 and diode 161. As in FIG. 5 the only discharge path to ground for capacitor 167 is through resistor 168 (resistor 169 in FIG. 5) because of the polarization of diode 161. Also the polarization of diode 161 effectively connects the base of transistor 151 directly to ground for motion braking pulse current when transistor 241 is on. Thus it will be seen that in FIG. 6 the transistor 241 serves to turn on the motion braking pulse current by grounding the cathode of diode 161 and at the same time provides a discharge path to ground for capacitor 167. Transistor 241 thus is connected to perform two functions and eliminate the necessity for transistor 245 of FIG. 5.

TABLE II

| ELEMENT REF. NO. | VALUE |
|---|---|
| RESISTANCE: | OHMS: |
| 143 | 248 |
| 145 | 1,000 |
| 155 | 3,830 |
| 157 | 3,010 |
| 158 | 2,700 |
| 165 | 442 |
| 168 | 1,400 |
| 169 | 1,000 |
| 174 | 3,300 |
| 179 | 13K |
| 183 | 1.0 M |
| 187 | 150K |
| 188 | 4,640 |
| 203, 205 | 300K |
| 204 | 5,000 |
| 206 | 100K |
| 207 | 7,500 |
| 211 | 750 |
| 219 | 9,530 |
| 221 | 21K |
| 227 | 3,900 |
| 231 | 750 |
| 239, 243 | 5,000 |
| CAPACITANCE: | MICROFARADS: |
| 147 | 100 |
| 166, 167 | 22 |
| 173 | 56 |
| 175 | .01 |
| 185 | 0.27 |
| 201 | 1.0 |
| 208 | 22 |
| 215 | 15 |
| SEMICONDUCTORS: | TYPE NUMBERS: |
| 149 | 2N2222 |
| 151 | 2N2907 |
| 159, 159A, 159B, 161 | 1N4153 |
| 163 | 2N2222 |
| 190 | 3140A |
| 209 | 1N754A |
| 210 | 3140A |
| 223 | 1N4576A |
| 230 | 3094A |
| 241, 245 | 2N2222 |

In FIG. 6 the resistor 145 has been eliminated and replaced by resistors 145A and 145B. The current-limiting effect of resistor 145A with respect to transistor 149 and the current-limiting effect of resistor 145B with respect to transistor 151 is the same as was the current-limiting effect of resistor 145 in FIG. 5. However, the resistors 145A and 145B serve to provide desirable isolation between the emitters of transistors 149 and 151. The stabilizing feed-back circuit through capacitor 185, resistor 183 to terminal 193 of amplifier 190 is connected to the junction of resistors 145A and 145B with coil 143.

From the foregoing description it will be seen that the circuit of FIG. 6 has been simplified by the elimination of one transistor and yet with the slight rearrangement of other circuit elements provides both the motion braking pulse function and the drive regulating function of the circuit of FIG. 5. Like the circuit of FIG. 5 the circuit of FIG. 6 will produce waveforms generally similar to FIG. 7-A, 7-B, and 7-C (at 100 Hz in FIGS. 5 and 6) except that the peak to peak amplitude of the square waveform A will not be substantially uniform as suggested in FIGS. 7-A through 7-C. Rather, within a time constant of several cycles, the peak to peak amplitude of waveform A will tend to be inversely varied as the width of pulse E. In other words the peak to peak value of waveform A will be quite large immediately following waveform cycles in which the width of pulse E is small (or zero) but will be reduced in value as the width of pulse E increases. After a few cycles of waveform A at reduced value, waveform C will be reduced in value, pulse E will be reduced in width, and an equilibrium will be established in the absence of additional changes in operating conditions. This equilibrium will be established at a much lesser value for width of pulse E than would be the case with the circuit of FIG. 4 since much of the necessary reduction in drive current is obtained by reduction of the peak to peak amplitude of waveform A. This has the effect of making the circuits of FIGS. 5 and 6 more efficient with respect to consumption of power and also tends to reduce the heat dissipation in coil 143 in those circuits. The circuit of FIG. 6 like the circuit of FIG. 5 utilizes peak to peak drive amplitude adjustment to achieve long term regulation at high efficiency while maintaining the less efficient motion braking pulse regulation to achieve very rapid correction for short term variations in condition. Computations show that a braking pulse reverse current with a total width of 9° and an amplitude four times that of the peak amplitude of the drive waveform has the same effect as reducing the amplitude of the drive waveform by about 16 percent with respect to providing net drive energy to the tuning fork over one cycle. For an 18° pulse the corresponding number is about 31 percent. The drive regulation circuits of FIGS. 5 and 6 produce a substantially greater relationship of actual amplitude reduction relative to pulse width so that the actual amplitude reduction is dominant in the long term in maintaining regulation.

The above computed values can only be considered approximate since the waveforms in practice are never truly square due to finite rise and fall times for the drive current. A useful rule of thumb for estimating the effects of braking pulse reverse current for narrow to medium width pulses is the produce of pulse width in degrees times the pulse depth relative to peak to peak square wave amplitude. This approximately gives the equivalent percent reduction in square wave drive amplitude.

It is apparent that drive regulation as provided in FIG. 2 or FIG. 3 can be added to other regulating circuits including, but not limited to, that of FIG. 4.

Although the invention has been described as illustratively applied to a drive regulation circuit for a tuning fork resonator used as an optical chopper, the principles of the invention are applicable to virtually any electrically driven device capable of producing a signal for monitoring velocity or position which is substantially sinusoidal in waveform; the sinusoidal waveform should vary in amplitude in proportion to the parameter being monitored and regulated; if the reverse current braking pulse feature is used with the invention it is desirable that the sinusoidal waveform have a frequency directly related to a frequency of the device being monitored and a constant phase relationship therewith. If the reverse current braking pulse feature is not used with the circuit then it is not strictly necessary to have the above-mentioned frequency and phase relationships.

In all cases where an alternating current device is referred to in this description and the following claims it will be understood that such a device may be powered by either alternating current or direct current so long as the device internally generates an alternating current or is capable of generating an alternating current in a monitoring element.

Although analog type circuits rather than digital circuits have been employed in the illustrative examples, it should be noted that digital circuits may be substituted for analog circuits in the present apparatus in accordance with presently known electronic circuit design procedures. For example, a capacitor charge and discharge circuit is employed to average the width of the amplitude control pulse width over a period of several cycles or more. High speed digital circuits would be capable of performing this function. Other functions such as comparison and the like could be performed by digital circuits replacing the analog circuits of the illustrated embodiments within the scope of the invention.

In addition to those modifications and variations of the apparatus shown or suggested above, other variations and modifications of the invention will be apparent to those skilled in the art and accordingly the scope of the invention is not to be considered limited to the embodiments described or suggested but it is rather to be determined by reference to the appended claims.

What is claimed is:

1. A drive current control circuit for an alternating current electrical device having an output comprising
   means for providing a drive current to said device,
   means for obtaining a sine wave electrical signal having an amplitude proportional to the output of said device,
   means for producing a constant reference signal for comparison with said sine wave electrical signal,
   means for producing a pulse signal having a pulse width which varies as the excess of said sine wave electrical signal over said reference signal,
   means for producing a control signal with a magnitude varying approximately as a moving average of the width of pulses of said pulse signal, and
   means for reducing said drive current to said device in response to said control signal.

2. Apparatus as recited in claim 1 wherein said control signal magnitude is significantly affected by at least ten preceding pulse signal pulses.

3. Apparatus as recited in claim 1 further including means for reversing the polarity of said drive current for a time interval determined by said pulse signal.

4. Apparatus as recited in claim 1 wherein
   said means for producing a constant reference signal includes a voltage reference device, and
   said means for producing a pulse signal includes an amplifier producing a fluctuating voltage signal,
   means for isolating an AC component of said voltage signal,
   a difference amplifier circuit connected to receive said AC component,
   means for establishing a DC level of said AC component determined by said voltage reference device and a voltage dividing circuit in parallel therewith, and
   means for connecting the undivided voltage of said voltage reference device to said difference amplifier circuit,
   the output of said difference amplifier circuit thereby providing an instantaneous AC voltage level-detecting, internally-referenced voltage comparison circuit.

5. Apparatus as recited in claim 1 wherein said means for producing a control signal inlcudes a capacitor, a diode connected to provide separate charge and discharge paths for said capacitor, and means for connecting one of said paths to said means for producing a pulse signal.

6. A drive current control circuit for an alternating current electrical device with an output comprising,
means for providing a drive current to said device,
means for obtaining a sine wave electrical signal having an amplitude proportional to the output of said device,
means for producing a reference signal for comparison with said sine wave electrical signal,
means for producing a pulse signal having a pulse width which varies non-linearly as the excess of said sine wave electrical signal over said reference signal,
means for producing a control signal with a magnitude varying approximately as an exponentially smoothed moving average of the width of pulses of said pulse signal, and
means for reducing said drive current to said device in response to said control signal.

7. Apparatus as recited in claim 6 wherein said control signal magnitude is significantly affected by at least four preceding pulse signal pulses.

8. Apparatus as recited in claim 6 further including means for reversing the polarity of said drive current for an interval determined by said pulse signal.

9. Apparatus as recited in claim 6 wherein
said means for producing a constant reference signal includes a voltage reference device, and
said means for producing a pulse signal includes an amplifier producing a fluctuating voltage signal,
means for isolating an AC component of said voltage signal,
a difference amplifier circuit connected to receive said AC component,
means for establishing a DC level of said AC component determined by said voltage reference device and a voltage dividing circuit in parallel therewith, and
means for connecting the undivided voltage of said voltage reference device to said difference amplifier circuit,
the output of said difference amplifier circuit thereby providing an instantaneous AC voltage level-detecting, internally-referenced voltage comparison circuit.

10. Apparatus as recited in claim 6 wherein said means for producing a control signal includes a capacitor, a diode connected to provide separate charge and discharge paths for said capacitor, and means for connecting one of said paths to said means for producing a pulse signal.

11. A drive circuit for an alternating current electrical device with an output comprising,
means for providing an alternating drive current substantially without a direct current component to said device,
means for obtaining a sine wave electrical signal having an amplitude proportional to the output of said device,
means for producing a constant reference signal for comparison with said sine wave electrical signal,
means for producing a pulse signal having a pulse width which varies directly as the time duration of the excess of said sine wave electrical signal over said reference signal,
means for producing a control signal with a magnitude varying approximately as a moving average of the width of pulses of said pulse signal, and
means for reducing said drive current to said device in response to said control signal.

12. Apparatus as recited in claim 11 wherein said control signal magnitude is significantly affected by at least four preceding pulse signal pulses.

13. Apparatus as recited in claim 11 further including means for reversing the polarity of said drive current for a time interval determined by said pulse signal.

14. Apparatus as recited in claim 11 wherein
said means for producing a constant reference signal includes a voltage reference device, and
said means for producing a pulse signal includes an amplifier producing a fluctuating voltage signal,
means for isolating an AC component of said voltage signal,
a difference amplifier circuit connected to receive said AC component,
means for establishing a DC level of said AC component determined by said voltage reference device and a voltage dividing circuit in parallel therewith, and
means for connecting the undivided voltage of said voltage reference device to said difference amplifier circuit,
the output of said difference amplifier circuit thereby providing an instantaneous AC voltage level-detecting, internally-referenced voltage comparison circuit.

15. Apparatus as recited in claim 11 wherein said means for producing a control signal includes a capacitor, a diode connected to provide separate charge and discharge paths for said capacitor, and means for connecting one of said paths to said means for producing a pulse signal.

16. Apparatus as recited in claim 11 wherein said means for providing an alternating drive current includes a PNP transistor and an NPN transistor connected as emitter followers with a common output.

17. A drive current control circuit for an alternating current electrical device having an output comprising
means for providing a drive current to said device,
means for obtaining a sine wave electrical signal having an amplitude proportional to the output of said device and a corresponding frequency,
means for producing a reference signal for comparison with said sine wave electrical signal,
means for producing a pulse signal having a pulse width which varies as the excess of said sine wave electrical signal over said reference signal,
means for producing a control signal with a magnitude varying as a moving average of the width of pulses of said pulse signal,
means for reducing said drive current to said device in response to said control signal, and
means for momentarily reversing the polarity of said drive current for a time interval determined by said pulse signal.

18. Apparatus as recited in claim 17 wherein said control signal magnitude is significantly affected by at least four preceding pulse signal pulses.

19. Apparatus as recited in claim 18 wherein
said means for producing a constant reference signal includes a voltage reference device, and
said means for producing a pulse signal includes an amplifier producing a fluctuation voltage signal, means for isolating an AC component of said voltage signal, a difference amplifier circuit connected to receive said AC component, means for establishing a DC level of said AC component determined by said voltage reference device and a voltage dividing circuit in parallel therewith, and means for connecting the undivided voltage of said voltage reference device to said difference amplifier circuit, the output of said difference amplifier circuit thereby providing an instantaneous AC voltage level-detecting, internally-referenced voltage comparison circuit.

20. Apparatus as recited in claim 18 wherein said means for producing a control signal includes a capacitor, a diode connected to provide separate charge and discharge paths for said capacitor, and means for connecting one of said paths to said means for producing a pulse signal.

* * * * *